United States Patent
Honda et al.

(10) Patent No.: US 7,605,378 B2
(45) Date of Patent: Oct. 20, 2009

(54) CHARGED-PARTICLE BEAM SYSTEM

(75) Inventors: Kazuhiro Honda, Tokyo (JP); Shinobu Uno, Tokyo (JP)

(73) Assignee: JEOL Ltd., Tokyo (JP)

( * ) Notice: Subject to any disclaimer, the term of this patent is extended or adjusted under 35 U.S.C. 154(b) by 323 days.

(21) Appl. No.: 11/585,049

(22) Filed: Oct. 23, 2006

(65) Prior Publication Data

US 2007/0114408 A1 May 24, 2007

(30) Foreign Application Priority Data

Nov. 1, 2005 (JP) ............................. 2005-317896

(51) Int. Cl.
*G21K 1/08* (2006.01)
(52) U.S. Cl. .................... 250/396 R; 250/310; 250/311
(58) Field of Classification Search ............. 250/396 R, 250/398, 311, 396 ML, 306
See application file for complete search history.

(56) References Cited

U.S. PATENT DOCUMENTS

| | | | |
|---|---|---|---|
| 6,723,997 B2 * | 4/2004 | Matsuya et al. | 250/396 R |
| 6,770,887 B2 * | 8/2004 | Krivanek et al. | 250/396 R |
| 6,852,983 B2 * | 2/2005 | Matsuya et al. | 250/396 ML |
| 6,924,488 B2 * | 8/2005 | Matsuya et al. | 250/396 R |
| 6,930,312 B2 * | 8/2005 | Matsuya et al. | 250/396 R |
| 7,015,481 B2 * | 3/2006 | Matsuya | 250/398 |
| 7,211,804 B2 * | 5/2007 | Yoshida et al. | 250/396 R |
| 2003/0098415 A1 * | 5/2003 | Matsuya et al. | 250/306 |
| 2003/0122076 A1 * | 7/2003 | Matsuya et al. | 250/311 |
| 2004/0004192 A1 * | 1/2004 | Krivanek et al. | 250/396 R |
| 2004/0036030 A1 * | 2/2004 | Matsuya et al. | 250/396 R |
| 2004/0227099 A1 * | 11/2004 | Matsuya | 250/398 |
| 2005/0017194 A1 * | 1/2005 | Matsuya et al. | 250/396 R |

FOREIGN PATENT DOCUMENTS

JP 2004-087460 3/2004

OTHER PUBLICATIONS

Von H. Rose, "Abbildungseigenschaften sphärisch korrigierter elektronenoptischer Achromate", *Optik 33, Heft 1* (1971), pp. 1-24.
M. Haider, W. Bernardt and H. Rose, "Design and Test of an Electric and Magnetic Dodecapole Lens", *Optik 63*, No. 1 (1982), pp. 9-23.

(Continued)

*Primary Examiner*—Nikita Wells
*Assistant Examiner*—Johnnie L Smith
(74) *Attorney, Agent, or Firm*—The Webb Law Firm (57) ABSTRACT

There is disclosed a charged-particle beam system equipped with a higher-order aberration corrector capable of correcting fifth-order spherical aberration and third-order chromatic aberration such that the primary trajectory of an electron beam is not affected by the strength of a transfer lens. The corrector is so adjusted that the image point of the corrector is located at a position shifted a distance of L0 from the principal plane of an objective lens toward the electron source. The transfer lens is so disposed that the position of the principal plane is coincident with the image point of the corrector. Therefore, the primary trajectory of the electron beam passes through the center of the transfer lens. Consequently, the primary trajectory is not affected by the strength of the transfer lens.

15 Claims, 9 Drawing Sheets

OTHER PUBLICATIONS

J. Zach, "Design of a High-Resolution Low-Voltage Scanning Electron Microscope", *Optik 83*, No. 1 (1989), pp. 30-40.

Joachim Zach and Maximilian Haider, "Aberration Correction in a Low Voltage SEM by a Multipole Corrector", *Nuclear Instruments and Methods in Physics Research A 363* (1995), pp. 316-325.

E. Munro, J. Orloff, R. Rutherford, J. Wallmark, "High-Resolution, Low-Energy Beams By Means Of Mirror Optics," *J. Vac. Sci. Technol. B*, vol. No. 6, Nov./Dec. 1988, pp. 1971-1976.

\* cited by examiner

CHARGED-PARTICLE BEAM SYSTEM

BACKGROUND OF THE INVENTION

1. Field of the Invention

The present invention relates to a charged-particle beam system equipped with a device for correcting chromatic and spherical aberrations, such as an electron beam system (e.g., a scanning electron microscope) or an ion beam system (e.g., an ion microprobe).

2. Description of Related Art

In a scanning electron microscope or transmission electron microscope, an aberration corrector is incorporated in the electron optics in order to provide high-resolution imaging or to enhance the probe current density. One proposed example of this aberration corrector uses a combination of electrostatic quadrupole elements and magnetic quadrupole elements to correct chromatic aberration. The corrector also uses four stages of octupole elements to correct spherical aberration. The principle is introduced in detail in the following references: V. H. Rose, *Optik* 33, Heft 1, 1-24 (1971); J. Zach, *Optik* 83, No. 1, 30-40 (1989); J. Zach and M. Haider, *Nucl. Instr. and Meth. In Phys. Res.* A 363, 316-325 (1995); and M. Haider et al., *Optik* 63, No. 1, 9-23 (1982)

Figure 1:
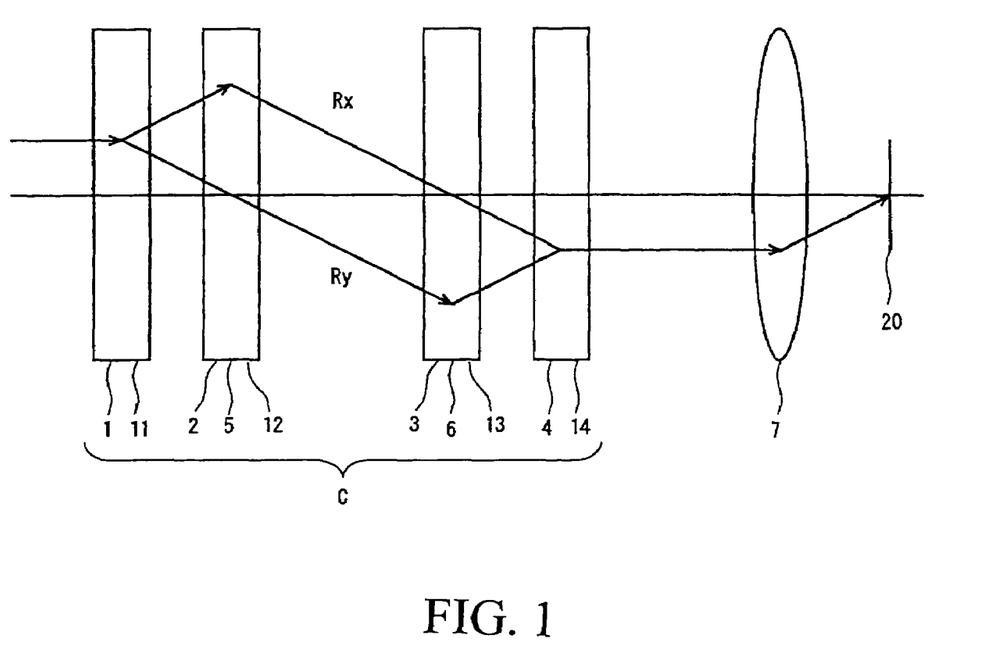
FIG. 1 is a diagram schematically illustrating the principle of an aberration corrector.

The principle of the above-described aberration corrector is described briefly now by referring to FIG. 1, where an aberration corrector C is placed ahead of an objective lens 7. The aberration corrector C comprises four stages of electrostatic multipole elements 1, 2, 3, 4, two stages of magnetic quadrupole elements 5, 6, and four stages of electrostatic octupole elements 11, 12, 13, 14. The two stages of magnetic quadrupole elements 5, 6 create a magnetic potential distribution analogous to the electric potential distribution created by the second and third stages of the electrostatic multipole elements to produce a magnetic field superimposed on the electric field. The four stages of electrostatic octupole elements 11, 12, 13, 14 create an electric field superimposed on the electric field created by the four stages of electrostatic quadrupole elements.

Figure 2:
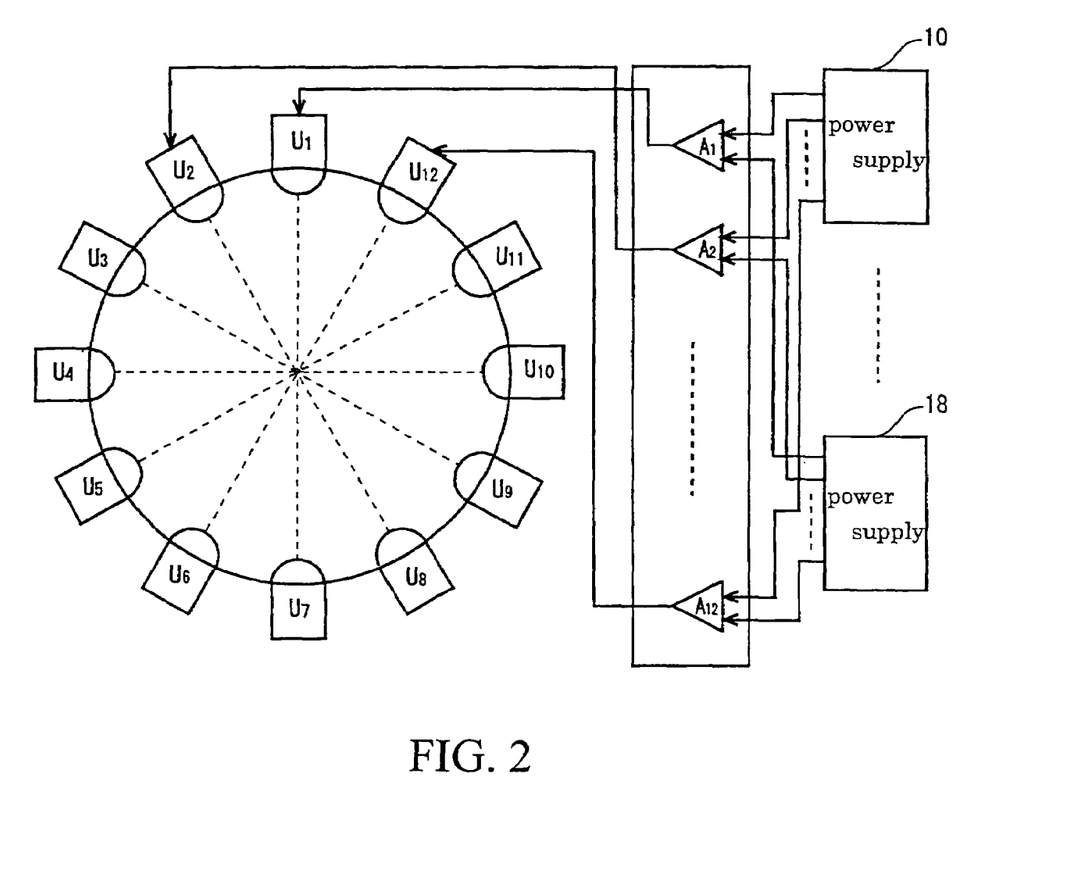
FIG. 2 is a diagram illustrating a method of using an electrostatic 12-pole element as an electrostatic multipole element having less than 12 poles.
Figure 3:
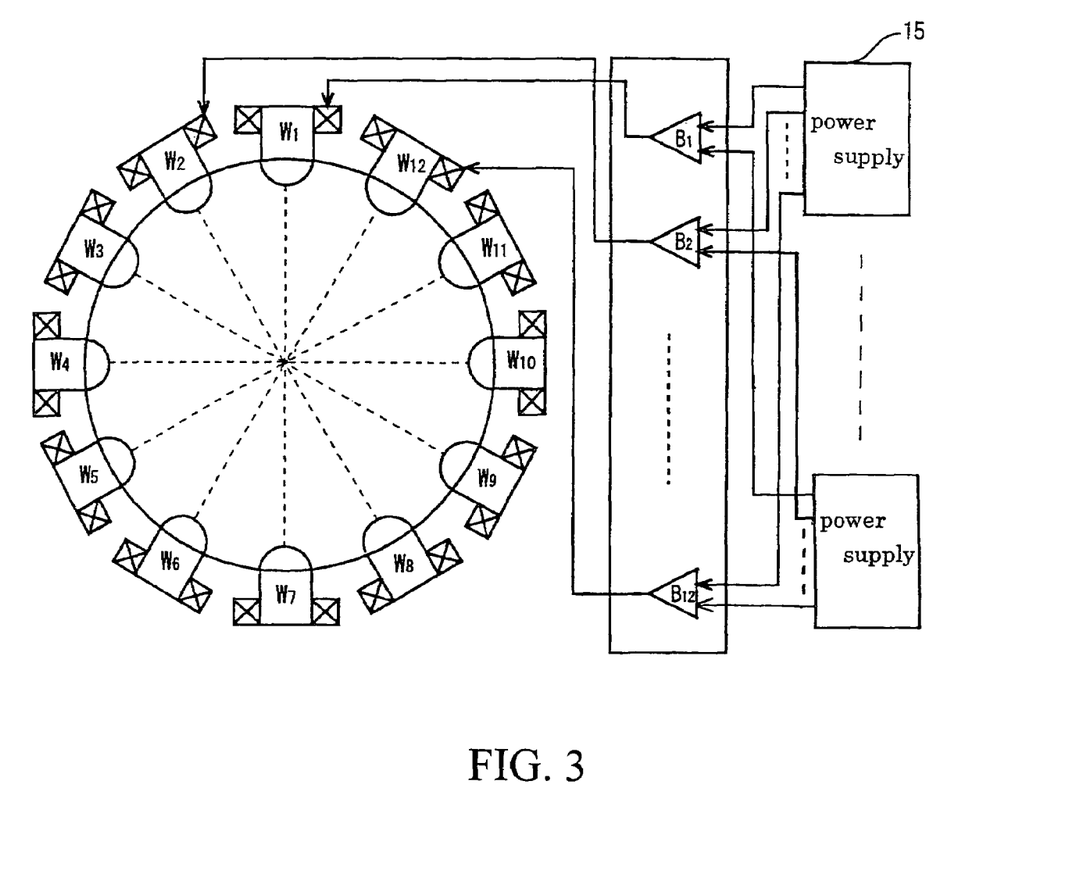
FIG. 3 is a diagram illustrating a method of using a magnetic 12-pole element as a magnetic multipole element having less than 12 poles.

Superimposition of electric potentials, superimposition of magnetic potentials (magnetic excitations), and superimposition of electric and magnetic potentials are next described by referring to FIGS. 2 and 3.

In the case of an electrostatic design, a final stage of power supplies $A_n$ (n=1, 2, . . . , 12) capable of supplying a voltage to 12 electrodes $U_n$ (n=1, 2, . . . , 12) independently is connected as shown in FIG. 2. Where a quadrupole electric field is produced, output voltages from a quadrupole power supply 10 are supplied to the final-stage power supplies $A_n$ to obtain a field close to an ideal quadrupole electric field. If it is assumed that the output voltages from the final-stage power supplies $A_n$ are proportional to the output voltages from the quadrupole power supply 10, the ratio of the output voltages from the power supply 10 assumes a value as given in the reference to M. Haider et al. referenced above. Where an octupole electric field is created such that it is superimposed on the quadrupole electric field, output voltages from an octupole power supply 18 are added to the output voltages from the quadrupole power supply 10 and supplied to the final-stage power supplies $A_n$ to obtain an electric field close to an ideal octupole electric field. Similarly, an electric field on which a multipole electric field produced by a 2n-pole element (n=1, 2, . . . , 6) is superimposed is obtained using the single dodecapole (12-pole) element.

In the case of a magnetic design, a final stage of power supplies $B_n$ (n=1, 2, . . . , 12) capable of supplying excitation currents to the coils on 12 magnets $W_n$ (n=1, 2, . . . , 12) independently is connected as shown in FIG. 3. Where a quadrupole magnetic field is created, output voltages from a magnetic quadrupole-element power supply 15 are supplied to the final stage of power supplies $B_n$ to produce a magnetic field close to an ideal quadrupole magnetic field. If it is assumed that the output currents from the final-stage power supplies $B_n$ are proportional to the output voltage from the magnetic quadrupole-element power supply 15, the ratio of the output voltages from the power supply 15 assumes an exciting magnetic force ratio as given in the reference to M. Haider et al. referenced above. In the description provided so far, superimposition of multipole magnetic fields other than a quadrupole magnetic field has not been explained. However, a multipole magnetic field can be superimposed in the same way as in the electrostatic design, by adding voltages for multipole magnetic fields to the input voltage to the final-stage power supplies $B_n$. A yoke for magnetically connecting the outside portions of the magnets $W_n$ is omitted in FIG. 3.

Where electrostatic and magnetic designs are superimposed, a conductive magnetic material may be used so that the magnets $W_n$ can act also as the electrodes $U_n$. In this case, the coils on the magnets are mounted so as to be electrically isolated from the electrodes.

In the description given below, the 2n-pole elements are treated as if they were stacked on top of each other to simplify the explanation. In practice, superimposition of multipole fields on a single dodecapole (12-pole) field is achieved by adding voltage signals as mentioned previously.

A multipole element that is equivalent in function to a structure having reference electrodes in the X-direction is usually known as a normal 2n-pole element (n=1, 2, . . . , 6). A multipole element that is equivalent in function to a structure obtained by rotating the normal 2n-pole element through an angle equal to $1/2(=2\pi/4n=\pi/2n[md]$ or 90/n [deg]) of the pitch angle of the electrodes is known as a skew 2n-pole element. Similarly, in the case of magnetic type, a multipole element that is equivalent in function to electrodes of an electrostatic skew 2n-pole element is known as a normal 2n-pole element. A multipole element that is equivalent in function to a structure obtained by replacing the electrodes of the electrostatic normal 2n-pole element by magnetic pole pieces is known as a skew 2n-pole element. The electrostatic design and magnetic design are different in arrangement of electrodes and magnetic pole pieces in normal multipole element or skew multipole element, because the directions in which charged particles undergo forces from these fields are selected to be aligned on the same straight line. In the following description, these electrodes and magnetic pole pieces (or magnetic poles) may be referred to as pole elements in a case where it is not necessary to discriminate between the electrodes and magnetic pole pieces.

To conveniently discriminate between different ways of mounting multipole elements to particle beam equipment, in a case where the straight line connecting pole elements to which electric potentials U1 and U7 are applied as shown in FIG. 2 is coincident with the X-direction, the multipole elements are referred to as multipole elements (12-pole elements) of normal arrangement. Where a straight line connecting midpoints between these pole elements and adjacent pole elements is coincident with the X-direction, the multipole elements are referred to as multipole elements (12-pole elements) of skew arrangement. A multipole element of skew arrangement can be used as a multipole element of normal arrangement if the method of applying potentials to the pole element is varied (see M. Haider et al. referenced above).

Actual operation performed using the above-described four multipole elements 14 is next described by referring to FIG. 1. A normal dipole element acts as a deflecting device in the X-direction. A skew dipole element acts as a deflecting device in the Y-direction. These are used for axial alignment. Description of their details is omitted herein.

Adjustment of the focus of a beam of charged particles, i.e., formation of a reference trajectory, is first described. In the configuration of FIG. 1, the beam of charged particles enters from the left side as viewed in the plane of the sheet. A reference trajectory for the beam of the charged particles is created by four stages of electrostatic quadrupole elements 1, 2, 3, 4 and by an objective lens 7. The beam is focused onto a surface 20 of a specimen. In FIG. 1, both trajectory $R_x$ in the X-direction of the particle beam and trajectory $R_y$ in the Y-direction are drawn schematically on the same plane.

The reference trajectory is taken as a paraxial trajectory (i.e., a trajectory assumed when there is no aberration). The quadrupole element 1 causes the Y-direction trajectory $R_y$ to pass through the center of the quadrupole element 2. The quadrupole element 2 causes the X-direction trajectory $R_x$ to pass through the center of the quadrupole element 3. Finally, the quadrupole elements 3, 4 and objective lens 7 cause the beam of charged particles to be focused onto the specimen surface. In practice, these need to be adjusted mutually for complete focusing.

Referring more particularly to FIG. 1, the charged-particle beam in the X-direction trajectory $R_x$ is diffused by the quadrupole element 1 acting like a concave lens. Then, the beam is converged to the center of the quadrupole element 3 by the quadrupole element 2 acting like a convex lens. The beam is thus made to pass through the center of the quadrupole element 3. Then, the beam is focused by the quadrupole element 4 and travels toward the objective lens 7. On the other hand, the charged-particle beam in the Y-direction trajectory $R_y$ is focused to the center of the quadrupole element 2 by the quadrupole element 1 and made to pass through the center of the quadrupole element 2. Then, the beam is focused by the quadrupole element 3. Finally, the beam is diffused by the quadrupole element 4 and moves toward the objective lens 7. In this way, the function of a single concave lens is created by combining the diffusive action of the quadrupole element 1 acting on the X-direction trajectory $R_x$ and the diffusive action of the quadrupole element 4 acting on the Y-direction trajectory $R_y$.

Correction of chromatic aberration using the aberration corrector C is next described. To correct chromatic aberration by the system shown in FIG. 1, the potential $\phi_{q2}$ [V] at the electrostatic quadrupole element 2 and the magnetic excitation $J_2$ [AT] (magnetic potential) of the magnetic quadrupole element 5 are adjusted such that the reference trajectory is not affected. The whole lens system acts to correct the X-direction chromatic aberration to zero. Similarly, the potential $\phi_{q3}$ [V] at the electrostatic quadrupole element 3 and the magnetic excitation $J_3$ [AT] of the magnetic quadrupole element 6 are adjusted such that the reference trajectory is not varied. The Y-direction chromatic aberration is corrected to zero over the whole lens system.

Correction of the second-order aperture aberration using a hexapole element is next described. Under ideal conditions, the second-order aperture aberration should not be produced. However, because of mechanical accuracy limitations, the second-order aperture aberration is produced in practice in a parasitic manner on the aberration corrector C. First, the second stage of multipole element 2 is operated as a hexapole element. The second-order aperture aberration in the X-direction is corrected to 0 by the potential $\phi_{S2}$ [V] at the hexapole element over the whole lens system. The electrostatic octupole element 13 is operated as a hexapole element. The second-order aperture aberration in the Y-direction is corrected to 0 by the potential $\phi_{S3}$ [V] at this hexapole element. Then, the second-order aperture aberration in a direction that is a combination of the X- and Y-directions (e.g., in a direction shifted by 30° or 60° from the X-axis) is corrected to 0 by operating the first stage of quadrupole element 1 and the fourth stage of multipole element 4 as hexapole elements.

Correction of spherical aberration (correction of the third-order aperture aberration) is next described. Where spherical aberration is corrected, X- and Y-direction chromatic aberrations are corrected. Then, the X-direction spherical aberration in the whole lens system is corrected to zero by the potential $\phi_{O2}$ [V] at the electrostatic octupole element 12. The Y-direction spherical aberration is corrected to zero by the potential $\phi_{O3}$ [V] at the electrostatic octupole element 13. Then, the spherical aberration in the resultant direction of the X- and Y-directions is corrected to zero by the electrostatic octupole elements 11 and 14 in the first and fourth stages, respectively. In practice, repeated mutual adjustments are necessary.

Figure 4A:
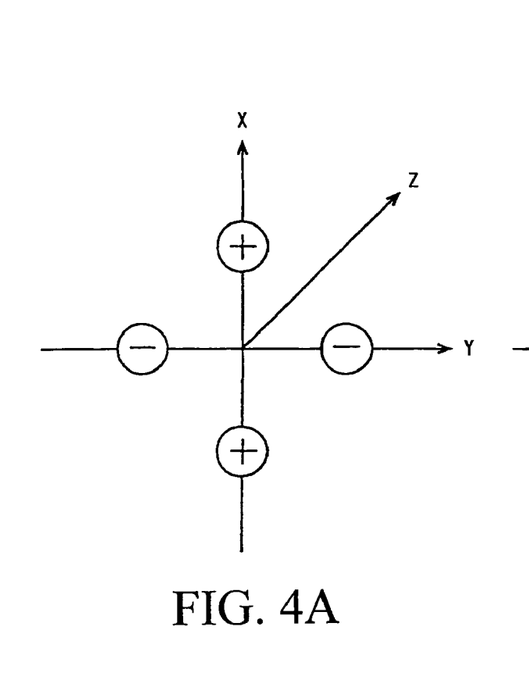
FIGS. 4A and 4B are diagrams showing normal arrangement of electrostatic multipole elements.
Figure 4B:
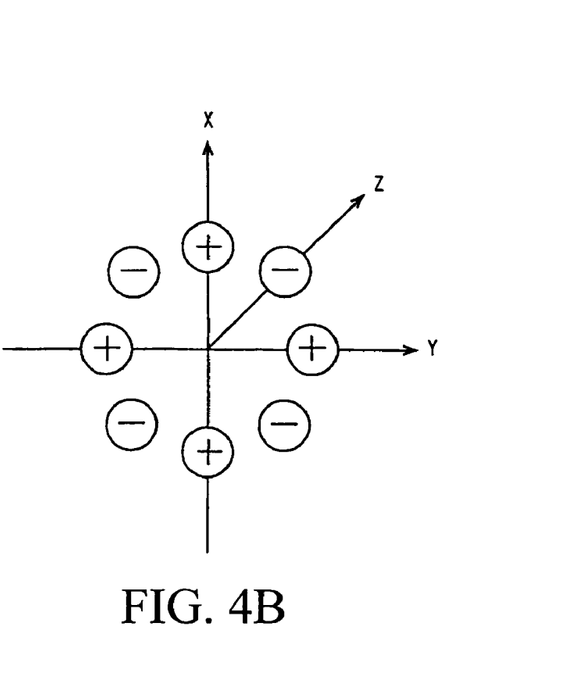

Potential or voltage $\phi$ used in the following description regarding electrostatic multipole elements indicates a positive (+) value of the multipole elements arranged normally as shown in FIGS. 4A and 4B. Similarly, magnetic excitation J of the magnetic type indicates magnetic excitation [AT] on the positive (+) side.

Figure 5:
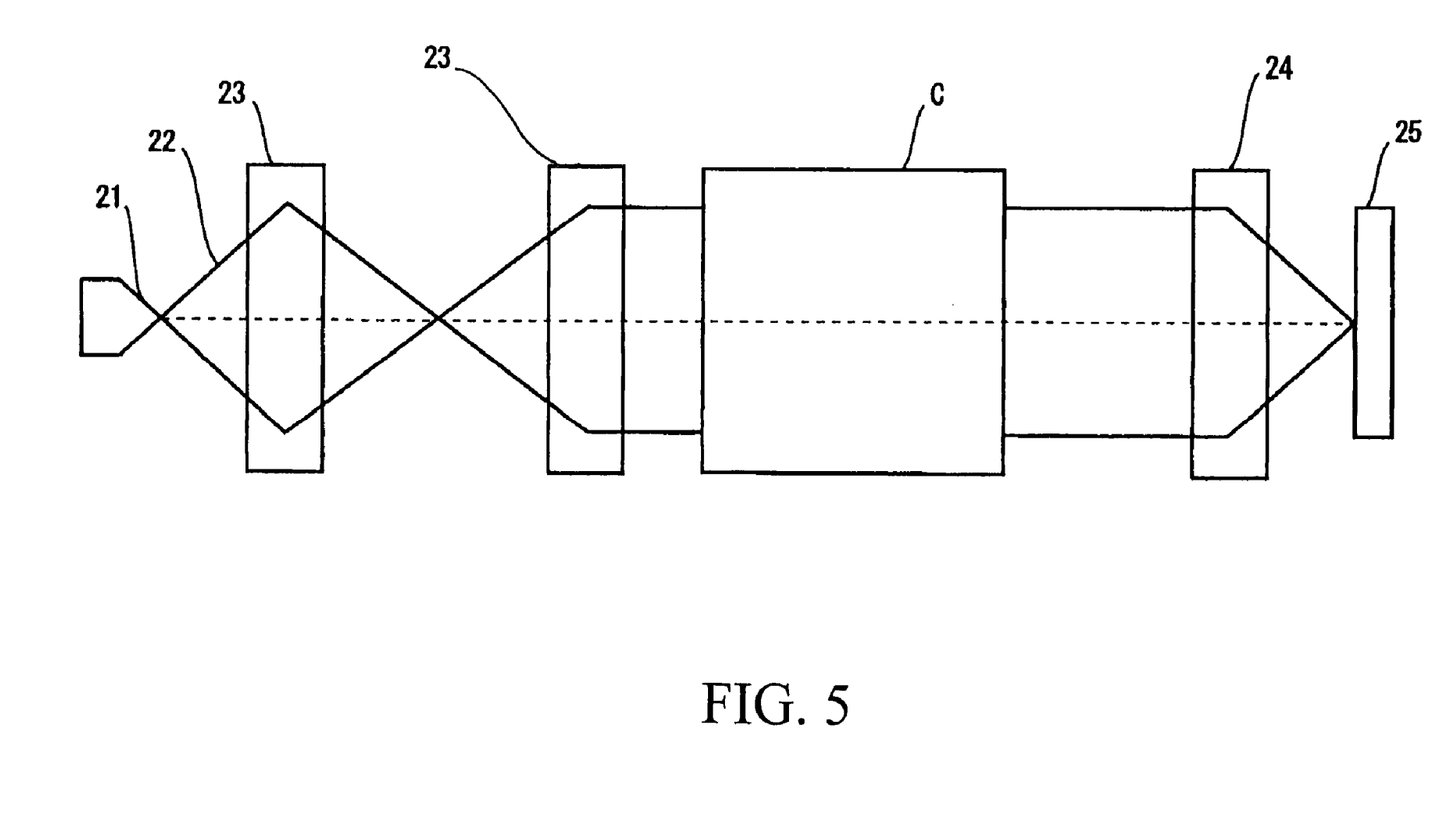
FIG. 5 is a diagram showing a scanning electron microscope equipped with a related art aberration corrector.

A scanning electron microscope is shown in FIG. 5 as one example of a charged-particle beam system using the above-described aberration corrector C. In FIG. 5, an electron gun has an emitter 21 emitting an electron beam 22, which enters the aberration corrector C through plural lenses 23. At this time, the lenses 23 control the beam 22 hitting the corrector C to focus the beam transmitted through the corrector C onto the surface of a specimen 25 by an objective lens 24. This corrector C is the aberration corrector shown in FIG. 1.

The electron beam is scanned over the surface of the specimen 25. Secondary electrons ejected from the surface of the specimen are detected by a detector in synchronism with the scanning. A scanned secondary electron image of the surface of the specimen is displayed on the viewing screen of a cathode-ray tube (CRT) by supplying the output signal from the detector as a brightness modulating signal for the CRT in synchronism with the scanning of the beam over the specimen.

In the above-described scanning electron microscope, the third-order spherical aberration and first-order chromatic aberration are corrected by the fact that the electron beam transmitted through the aberration corrector C already described in connection with FIG. 1 passes through the given X- and Y-trajectories. In this way, the resolution of the scanning electron microscope can be improved greatly.

After the third-order spherical aberration and the first-order chromatic aberration have been corrected by the aberration corrector C described above, aberrations limiting the resolution of the scanning electron microscope are the fifth-order spherical aberration and third-order chromatic aberration. These aberrations are known as higher-order aberrations and cannot be corrected by the aforementioned aberration corrector.

Methods of correcting the higher-order aberrations are described in detail in U.S. Pat. No. 6,924,488 and JP2004-087460. In particular, plural transfer lenses having a function of projecting an aberration generation point present near the rear end of an aberration corrector onto the front focal point of the objective lens are disposed between the aberration corrector C and the objective lens 24.

Figure 6:
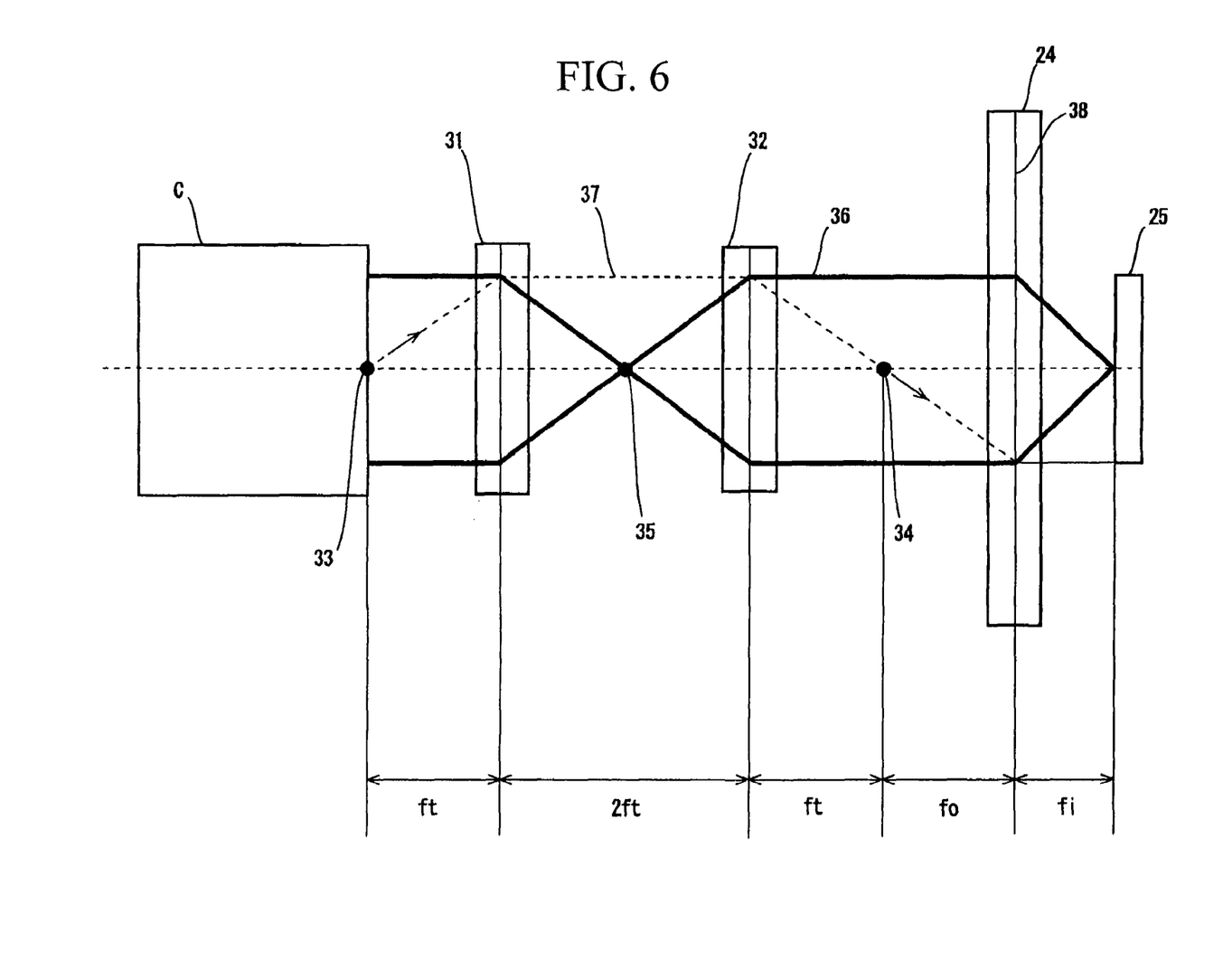
FIG. 6 is a diagram showing a configuration for correcting higher-order aberrations by using plural transfer lenses.

An example of the structure for correcting higher-order aberrations described in the patent references is shown in FIG. 6, where there are shown plural transfer lenses, i.e., a first transfer lens 31 and a second transfer lens 32. A point 33 at which aberration is produced (hereinafter may be referred to as the aberration generation point) is projected onto the front focal point 34 of the objective lens 24 using the plural transfer lenses 31 and 32, thus correcting the higher-order aberrations. Also shown in FIG. 6 are an object point 35, the primary trajectory of an electron beam indicated by solid line 36, an aberration trajectory indicated by broken line 37, the principal plane 38 of the objective lens, the focal distanced of the transfer lenses, and the front focal distance $f_o$ of the objective lens 24.

Figure 7:
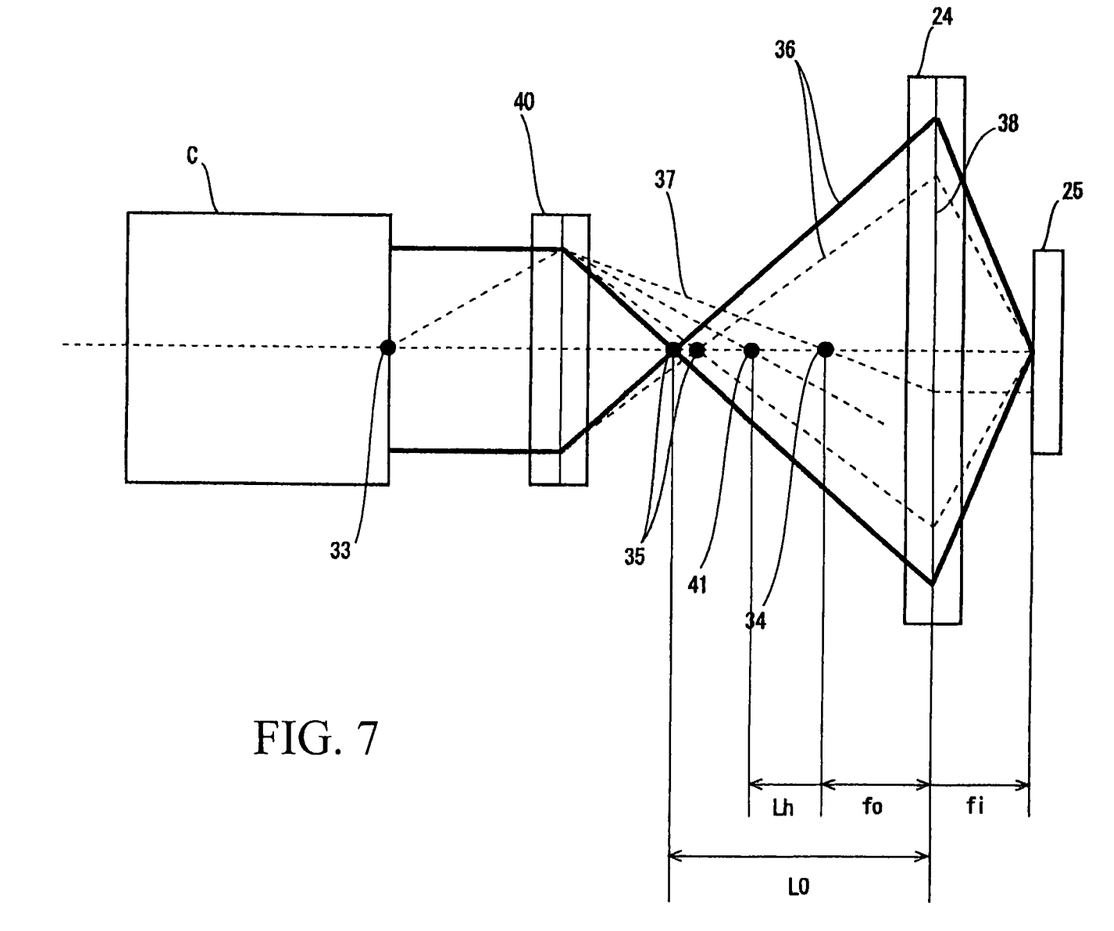
FIG. 7 is a diagram showing a configuration for correcting higher-order aberrations by using a single stage of transfer lens.

It is also possible to correct the higher-order aberrations using only one stage of transfer lens instead of plural transfer lenses. A structure using this single stage of transfer lens is also described in detail in the above-cited patent references. This structure is shown in FIG. 7. Like components are indicated by like reference numerals in both FIGS. 6 and 7. Detailed description of already described components is omitted. Shown in FIG. 7 are the single stage of transfer lens 40 and a transfer point 41.

The principle of correcting the higher-order aberrations using the transfer lens is described in detail, for example, in *Nucl. Instr. and Meth. In Phys.* Res. A 519, 264-279 (2004). The principle can be understood from the forms of the following two composite aberration coefficients, i.e., fifth-order spherical aberration coefficient C5s and third-order chromatic aberration coefficient C3c:

$$C5s = 3\frac{Cs^2}{f_0^2}Lh \quad (1)$$

$$C3c = 4\frac{CsCc}{f_0^2}Lh \quad (2)$$

In Eqs. (1) and (2) above, Cs and Cc are the third-order spherical aberration coefficient and first-order chromatic aberration coefficient, respectively, of the objective lens 24. Lh is the distance between a transfer point 41 at which an aberration generation point 33 is projected by the transfer lens 40 and the front focal point 34 of the objective lens 24. $f_0$ is the front focal distance of the objective lens 24. As can be seen from Eqs. (1) and (2), when the distance Lh decreases down to 0, the coefficients C5s and C3c become null. This state can be realized by optimizing the strength and position of the transfer lens such that the transfer point 41 becomes the front focal point 34 of the objective lens 24 as shown in FIG. 7.

However, in order to realize the correction conditions under which Lh=0 is satisfied, using the plural transfer lenses 31 and 32 already described in connection with FIG. 6, restrictive conditions are imposed on the positions and strength of the transfer lenses 31 and 32. That is, as shown in FIG. 6, to permit a collimated electron beam emerging from the aberration corrector C to hit the objective lens 24 in a collimated manner via the two stages of transfer lenses 31 and 32 and to project an aberration generation point 33 at the front focal point 34 of the objective lens 24, the positional relationship between the two stages of transfer lenses 31 and 32 is restricted by the focal distanced of the transfer lenses as shown in FIG. 6.

Accordingly, there is the problem that use of the two stages of transfer lenses increases the length of the microscope column of the scanning electron microscope. That is, a length of about 4 ft is required. For example, where it is assumed that ft=200 mm, a length of 800 mm is necessary. This is undesirable where external disturbances, such as vibrations, are taken into account. Usually, a scanning lens for scanning the electron beam and a secondary electron detector for detecting secondary electrons produced from the specimen are disposed between the transfer lens 32 and the objective lens 24. Therefore, it is difficult to reduce the length. Where the transfer lens 40 is made of a single stage as shown in FIG. 7, the primary trajectory 36 of the beam is varied by the position and strength of the transfer lens 40. Consequently, there is the problem that the optimum conditions for the whole system are complicated.

SUMMARY OF THE INVENTION

It is an object of the present invention to provide a charged-particle beam system equipped with a higher-order aberration corrector capable of correcting fifth-order spherical aberration and third-order chromatic aberration such that the primary trajectory of an electron beam is not affected by the strength of a transfer lens.

A charged-particle beam system, according to a first embodiment of the present invention, has a source of a beam of charged particles, an objective lens, and an aberration corrector for correcting third-order spherical aberration, the aberration corrector being mounted between the source of the beam and the objective lens. A transfer lens for correcting fifth-order spherical aberration and third-order chromatic aberration is placed such that the principal plane of the transfer lens is located at the image point of the aberration corrector.

A charged-particle beam system, according to a second embodiment of the present invention, is based on the first embodiment and further characterized in that the strength of the transfer lens is so set that an aberration generation point in the aberration corrector is projected at the front focal point of the objective lens or at a coma-free point.

A charged-particle beam system, according to a third embodiment of the present invention, is based on any one of the first and second embodiments and further characterized in that the aberration corrector corrects the third-order spherical aberration. The beam system has a function of correcting the fifth-order spherical aberration and third-order chromatic aberration while holding the trajectory of the charged-particle beam assumed when the third-order spherical aberration was corrected.

A charged-particle beam system, according to a fourth embodiment of the present invention, is based on the third embodiment and further characterized in that the beam system has a function of adjusting the strength of the transfer lens in such a way that the fifth-order spherical aberration and third-order chromatic aberration are corrected.

A charged-particle beam system, according to a fifth embodiment of the present invention, is based on the third embodiment and further characterized in that the beam system has a function of controlling the strength of the transfer lens to adjust the resolution of a scanned image.

A charged-particle beam system, according to a sixth embodiment of the present invention, is based on the third embodiment and further characterized in that the beam system has a function of controlling the strength of the transfer lens to adjust the contrast of a scanned image.

A charged-particle beam system, according to a seventh embodiment of the present invention, has a source of a beam of charged particles, a deceleration objective lens, and an aberration corrector for correcting third-order spherical aberration. The aberration corrector is mounted between the source of the beam and the objective lens. The system further includes an additional accelerating lens for correcting the fifth-order spherical aberration and third-order chromatic aberration. The principal plane of the additional accelerating lens is placed at the image point of the aberration corrector.

A charged-particle beam system, according to an eighth embodiment of the present invention, is based on the seventh embodiment and further characterized in that the strength of the additional accelerating lens is so set that an aberration generation point in the aberration corrector is projected at the front focal point of the objective lens or at a coma-free point.

A charged-particle beam system, according to a ninth embodiment of the present invention, is based on any one of the seventh and eighth embodiments and further characterized in that the aberration corrector corrects third-order spherical aberration. The system has a function of correcting fifth-order spherical aberration and third-order chromatic aberration while holding the trajectory of the charged-particle beam assumed when the third-order spherical aberration was corrected.

A charged-particle beam system, according to a tenth embodiment of the present invention, is based on the ninth embodiment and further characterized in that the beam system has a function of adjusting the strength of the additional accelerating lens such that the fifth-order spherical aberration and third-order chromatic aberration are corrected.

A charged-particle beam system, according to an eleventh embodiment of the present invention, has a source of a beam of charged particles, an objective lens of a superimposed electric and magnetic field type, and an aberration corrector for correcting third-order spherical aberration. The corrector is mounted between the source of the beam and the objective lens. The system further includes an additional accelerating lens for correcting fifth-order spherical aberration and third-order chromatic aberration. The principal plane of the accelerating lens is placed at the image point of the aberration corrector.

A charged-particle beam system, according to a twelfth embodiment of the present invention, is based on the eleventh embodiment and further characterized in that the strength of the additional accelerating lens is so set that an aberration generation point in the aberration corrector is projected at the front focal point of the objective lens or at a coma-free point.

A charged-particle beam system, according to a thirteenth embodiment of the present invention, is based on any one of the eleventh and twelfth embodiments and further characterized in that the aberration corrector corrects third-order spherical aberration. The beam system has a function of correcting fifth-order spherical aberration and third-order chromatic aberration while holding the trajectory of the charged-particle beam assumed when the third-order spherical aberration was corrected.

A charged-particle beam system, according to a fourteenth embodiment of the present invention, is based on the thirteenth embodiment and further characterized in that the beam system has a function of adjusting the strength of the additional accelerating lens such that fifth-order spherical aberration and third-order chromatic aberration are corrected.

A charged-particle beam system, according to a fifteenth embodiment of the present invention, is based on any one of the first through fourteenth embodiments and further characterized in that the aberration corrector is composed of four stages of electrostatic multipole elements and two stages of magnetic quadrupole elements for superimposing a magnetic potential distribution on an electric potential distribution created by two central stages of electrostatic quadrupole elements of the four stages, the magnetic potential distribution being analogous to the electric potential distribution. The system further includes an objective lens for focusing the beam of charged particles onto the specimen, means for applying a decelerating voltage to the specimen, a manipulation portion permitting a human operator to modify the accelerating voltage of the beam or the working distance between the objective lens and the specimen, and a control portion for controlling the multipole elements based on manipulation of the manipulation portion or on settings.

According to the first embodiment of the present invention, the fifth-order spherical aberration and third-order chromatic aberration can be corrected without increasing the length of the microscope column.

According to the second embodiment of the present invention, the fifth-order spherical aberration and third-order chromatic aberration can be corrected without increasing the length of the microscope column.

The third embodiment of the present invention yields the same advantages as the first and second embodiments. In addition, it is possible to correct the fifth-order spherical aberration and third-order chromatic aberration without varying the trajectory of the electron beam.

The fourth embodiment of the present invention yields the same advantages as the first and second embodiments. In addition, it is possible to correct the fifth-order spherical aberration and third-order chromatic aberration without varying the trajectory of the electron beam.

The fifth embodiment of the present invention yields the same advantages as the first and second embodiments. In addition, it is easy to correct higher-order aberrations because the trajectory of the electron beam is not varied. That is, the fifth-order spherical aberration and third-order chromatic aberration can be corrected after correcting lower-order aberrations (i.e., third-order spherical aberration and first-order chromatic aberration). Furthermore, the resolution of the scanned image can be adjusted optimally.

The sixth embodiment of the present invention yields the same advantages as the first and second embodiments. In addition, it is easy to correct higher-order aberrations because the trajectory of the electron beam is not varied. That is, the fifth-order spherical aberration and third-order chromatic aberration can be corrected after correcting lower-order aberrations (i.e., third-order spherical aberration and first-order chromatic aberration). Furthermore, the contrast of the scanned image can be set optimally.

The seventh embodiment of the present invention makes it possible to correct the fifth-order spherical aberration and third-order chromatic aberration by means of the additional accelerating lens in a case where a deceleration type lens is used as the objective lens.

The eighth embodiment of the present invention makes it possible to correct the fifth-order spherical aberration and third-order chromatic aberration by means of the additional accelerating lens in a case where a deceleration type lens is used as the objective lens.

The ninth embodiment of the present invention yields the same advantages as the seventh and eighth embodiments. In addition, it is possible to correct the fifth-order spherical aberration and third-order chromatic aberration without varying the trajectory of the electron beam.

The tenth embodiment of the present invention yields the same advantages as the seventh and eighth embodiments. In addition, it is possible to correct the fifth-order spherical aberration and third-order chromatic aberration without varying the trajectory of the electron beam.

The eleventh embodiment of the present invention makes it possible to correct the fifth-order spherical aberration and third-order chromatic aberration by means of the additional accelerating lens in a case where a lens of the superimposed electric and magnetic field type is used as the objective lens.

The twelfth embodiment of the present invention makes it possible to correct the fifth-order spherical aberration and third-order chromatic aberration by means of the additional accelerating lens in a case where a lens of the superimposed electric and magnetic field type is used as the objective lens.

The thirteenth embodiment of the present invention yields the same advantages as the eleventh and twelfth embodiments. In addition, it is possible to correct the fifth-order spherical aberration and third-order chromatic aberration without varying the trajectory of the electron beam.

The fourteenth embodiment of the present invention yields the same advantages as the eleventh and twelfth embodiments. In addition, it is possible to correct the fifth-order spherical aberration and third-order chromatic aberration without varying the trajectory of the electron beam.

The fifteenth embodiment of the present invention makes it possible to correct the third-order spherical aberration and first-order chromatic aberration accurately.

Other objects and features of the present invention will appear in the course of the description thereof, which follows.

DESCRIPTION OF THE PREFERRED EMBODIMENTS

Figure 8:
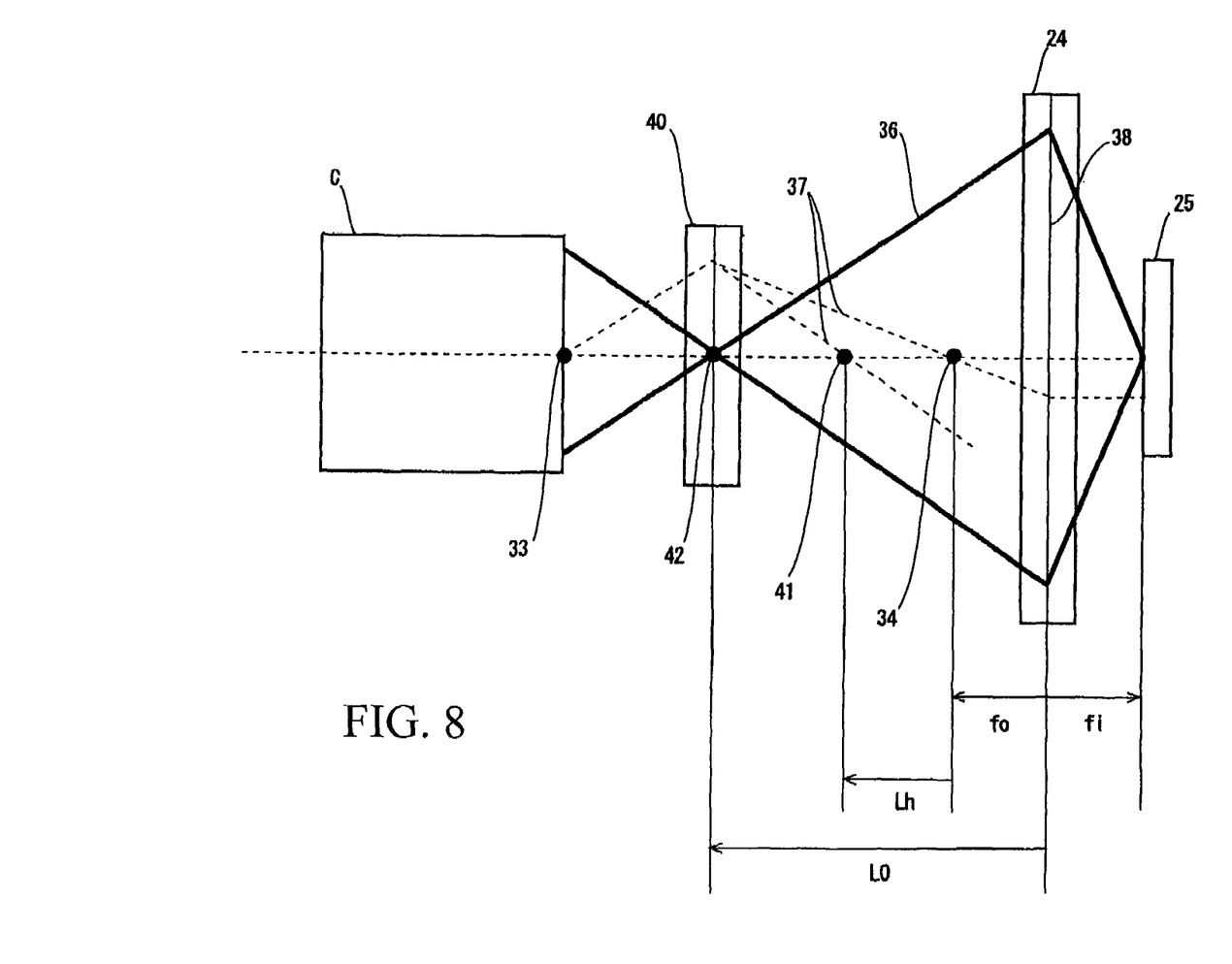
FIG. 8 is a diagram illustrating a first embodiment of the present invention.

Embodiments of the present invention are hereinafter described in detail with reference to the accompanying drawings. FIG. 8 shows one example of a scanning electron microscope equipped with an aberration corrector according to an embodiment of the present invention. The aberration corrector is designed to correct third-order spherical aberration as described, for example, by E. Munro in *J. Vac. Sci. Technol.* B 6(6), November/December (1988). The aberration corrector, C, is so adjusted that its image point 42 is shifted a distance of L0 from the principal plane 38 of an objective lens 24 toward the electron source.

A transfer lens 40 is so disposed that the position of the principal plane of the lens is coincident with the image point 42 of the aberration corrector C. Accordingly, the primary trajectory 36 of an electron beam passes through the center of the transfer lens 40. Consequently, the primary trajectory is not affected by the strength of the transfer lens 40. Under this condition, the strength of the transfer lens 40 is so set that an aberration generation point 33 in the corrector C is projected at the front focal point 34 of the objective lens 24. Usually, the aberration generation point 33 in the corrector C can be regarded as the center of the lens at the final stage (i.e., the lens closest to the specimen) out of lenses forming the aberration corrector. Furthermore, the strength of the transfer lens 40 for projecting the aberration generation point 33 at the front focal point 34 of the objective lens 24 may be so set that an aberration trajectory 37 emerging from the aberration generation point 33 converges at the front focal point 34 of the objective lens 24.

In this way, the distance Lh given by Eqs. (1) and (2) is reduced down to 0. It is possible to correct the fifth-order spherical aberration and third-order chromatic aberration. Usually, aberrations must be corrected from the lower order side. The aberration corrector corrects the third-order spherical aberration. At this time, the primary trajectory of the electron beam is determined. Then, the transfer lens 40 corrects the fifth-order spherical aberration and third-order chromatic aberration. The strength of the transfer lens can be adjusted while holding the primary trajectory assumed when the third-order spherical aberration was corrected.

Figure 9:
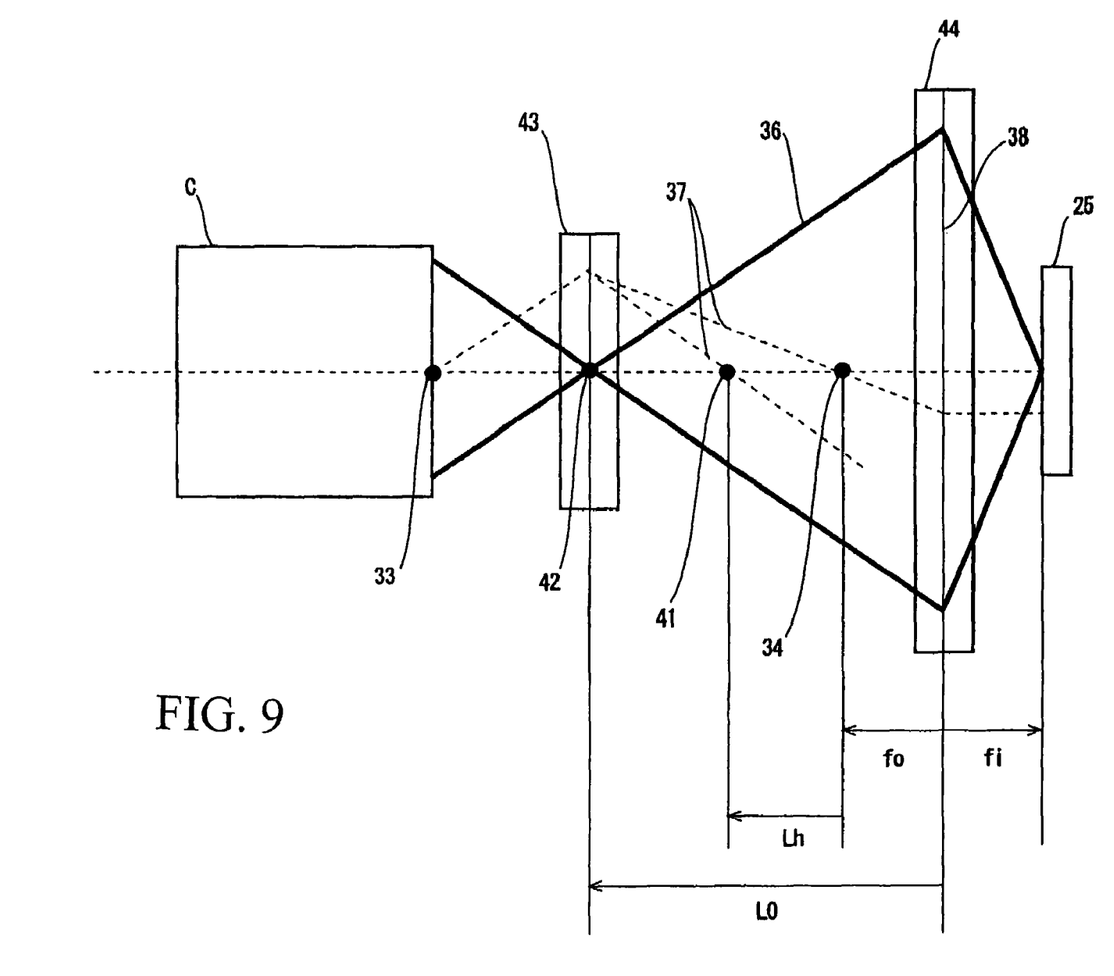
FIG. 9 is a diagram illustrating second and third embodiments of the present invention.

A second embodiment of the present invention is next described by referring to FIG. 9. This embodiment provides a scanning electron microscope having an aberration corrector C for correcting third-order spherical aberration and a deceleration objective lens 44. In this embodiment, the principal plane of an additional accelerating lens 43 is disposed at the image point 42 of the aberration corrector C to perform additional acceleration for projecting the aberration generation point 33 in the aberration corrector C at the front focal point 34 of the deceleration objective lens 44 or at a coma-free point. This will be described in further detail below.

In FIG. 9, the aberration corrector C is designed to correct third-order spherical aberration as described, for example, in the above-cited reference (E. Munro in *J. Vac. Sci. Technol.* B 6(6), November/December (1988)). The aberration corrector C is so adjusted that its image point 42 is shifted a distance of L0 from the principal plane 38 of the deceleration objective lens 44 toward the electron source. The position of the principal plane of the additional accelerating lens 43 is so disposed that the position of the principal plane of the lens 43 is coincident with the image point 42 of the corrector. Since the primary trajectory 36 of the electron beam passes through the center of the additional accelerating lens 43, additional acceleration performed by the accelerating lens 43 is not affected.

Under this condition, additional acceleration performed by the additional accelerating lens 43 is so set that the aberration generation point 33 in the aberration corrector C is projected at the front focal point 34 of the deceleration objective lens 44. Usually, the aberration generation point 33 in the corrector C can be regarded as being located at the center of the final stage of lens (i.e., the lens closest to the specimen) out of the plural lenses constituting the corrector C. Additional acceleration performed by the additional accelerating lens 43 for projecting the aberration generation point 33 at the front focal point 34 of the deceleration objective lens 44 may be so set that the aberration trajectory 37 emerging from the aberration generation point 33 converges at the front focal point 34 of the objective lens.

In this way, the distance Lh given by Eqs. (1) and (2) is reduced down to 0. The fifth-order spherical aberration and third-order chromatic aberration are corrected. Usually, aberrations must be corrected from the lower order side. The aberration corrector C corrects the third-order spherical aberration. At this time, the primary trajectory of the electron beam is determined. Then, the additional accelerating lens 43 corrects the higher-order aberrations. The additional acceleration performed by the additional accelerating lens can be adjusted while holding the primary trajectory assumed when the third-order spherical aberration was corrected.

A third embodiment of the present invention is next described. In this embodiment, an objective lens of the superimposed electric and magnetic field type is used instead of the deceleration objective lens as the objective lens 44 shown in FIG. 9. In this embodiment, the principal plane of the additional accelerating lens 43 is placed at the image point 42 of the aberration corrector C in the same way as in the second embodiment, and the electron beam is additionally accelerated such that the aberration generation point 33 in the corrector C is projected at the front focal point 34 of the objective lens 44 of the superimposed field type or at a coma-free point. This will be described in further detail below.

As described above, this embodiment is similar in configuration to the second embodiment described already in connection with FIG. 9 except that a superimposed field-type lens is used as the objective lens 44. The aberration corrector C is designed, for example, to correct third-order spherical aberration. The corrector C is so adjusted that the image point 42 of the corrector is shifted a distance of L0 from the principal plane 38 of the objective lens 44 toward the electron source. The additional accelerating lens 43 is so disposed that the position of the principal plane of the lens 43 is coincident with the image point 42 of the corrector C. Therefore, the primary trajectory of the electron beam passes through the center of the accelerating lens 43. In consequence, additional acceleration performed by the accelerating lens is not affected.

Under this condition, the additional acceleration done by the additional accelerating lens 43 is so set that the aberration generation point 33 in the aberration corrector C is projected at the front focal point 34 of the objective lens 44. Usually, the aberration generation point in the corrector C can be regarded as being located at the center of the final stage of lens (i.e., the lens closest to the specimen) out of plural lenses forming the corrector C. Furthermore, the additional acceleration produced by the additional accelerating lens 43 which projects the aberration generation point at the front focal point of the objective lens 44 may be so set that the aberration trajectory emerging from the aberration generation point converges at the front focal point of the objective lens 44.

In this way, the distance Lh given by Eqs. (1) and (2) is reduced down to 0. The fifth-order spherical aberration and third-order chromatic aberration are corrected. Usually, aberrations must be corrected from the lower order side. The aberration corrector C corrects the third-order spherical aberration. At this time, the primary trajectory of the electron beam is determined. Subsequently, the additional accelerating lens 43 corrects the higher-order aberrations. The additional acceleration produced by the accelerating lens 43 can be adjusted while holding the primary trajectory assumed when the third-order spherical aberration was corrected.

Having thus described our invention with the detail and particularity required by the Patent Laws, what is desired protected by Letters Patent is set forth in the following claims.

The invention claimed is:

1. A charged-particle beam system comprising:
   a source of a beam of charged particles;
   an objective lens;
   an aberration corrector for correcting third-order spherical aberration, the aberration corrector being mounted between the source of the beam and the objective lens, the aberration corrector defining an image point; and
   a transfer lens for correcting fifth-order spherical aberration and third-order chromatic aberration, the transfer lens being so placed that a principal plane of the transfer lens is located at the image point of the aberration corrector.

2. A charged-particle beam system as set forth in claim 1, wherein strength of said transfer lens is so set that an aberration generation point in the aberration corrector is projected at a front focal point of the objective lens or at a coma-free point.

3. A charged-particle beam system as set forth in claim 1 or 2, wherein said aberration corrector corrects the third-order spherical aberration, and wherein the charged-particle beam system has a function of correcting the fifth-order spherical aberration and third-order chromatic aberration while holding a trajectory of the beam of the charged particles assumed when the third-order spherical aberration was corrected.

4. A charged-particle beam system as set forth in claim 3, wherein the charged-particle beam system has a function of adjusting strength of said transfer lens such that the fifth-order spherical aberration and third-order chromatic aberration are corrected.

5. A charged-particle beam system as set forth in claim 3, wherein the charged-particle beam system has a function of controlling strength of said transfer lens to adjust resolution of a scanned image.

6. A charged-particle beam system as set forth in claim 3, wherein the charged-particle beam system has a function of controlling strength of said transfer lens to adjust contrast of a scanned image.

7. A charged-particle beam system comprising:
   a source of a beam of charged particles;
   a deceleration objective lens;
   an aberration corrector for correcting third-order spherical aberration, the aberration corrector being mounted between the source of the beam and the objective lens, the aberration corrector defining an image point; and
   an additional accelerating lens for correcting fifth-order spherical aberration and third-order chromatic aberration, the additional accelerating lens having a principal plane placed at the image point of the aberration corrector.

8. A charged-particle beam system as set forth in claim 7, wherein strength of said additional accelerating lens is so set that an aberration generation point in the aberration corrector is projected at a front focal point of the objective lens or at a coma-free point.

9. A charged-particle beam system as set forth in claim 7 or 8, wherein said aberration corrector corrects the third-order spherical aberration, and wherein the charged-particle beam system has a function of correcting the fifth-order spherical aberration and third-order chromatic aberration while holding a trajectory of the beam of the charged particles assumed when the third-order spherical aberration was corrected.

10. A charged-particle beam system as set forth in claim 9, wherein the charged-particle beam system has a function of adjusting strength of said additional accelerating lens such that the fifth-order spherical aberration and third-order chromatic aberration are corrected.

11. A charged-particle beam system comprising:
    a source of a beam of charged particles;
    an objective lens of a superimposed electric and magnetic field type;
    an aberration corrector for correcting third-order spherical aberration, the aberration corrector being mounted between the source of the beam and the objective lens, the aberration corrector defining an image point; and an additional accelerating lens for correcting the fifth-order spherical aberration and third-order chromatic aberration, the additional accelerating lens having a principal plane placed at the image point of the aberration corrector.

12. A charged-particle beam system as set forth in claim 11, wherein strength of said additional accelerating lens is so set that an aberration generation point in the aberration corrector is projected at a front focal point of the objective lens or at a coma-free point.

13. A charged-particle beam system as set forth in claim 12, wherein said aberration corrector corrects the third-order spherical aberration, and wherein the charged-particle beam system has a function of correcting the fifth-order spherical aberration and third-order chromatic aberration while holding a trajectory of the beam of the charged particles assumed when the third-order spherical aberration was corrected.

14. A charged-particle beam system as set forth in claim 13, wherein the charged-particle beam system has a function of adjusting strength of said additional accelerating lens such that the fifth-order spherical aberration and third-order chromatic aberration are corrected.

15. A charged-particle beam system as set forth in any one of claims 1, 7 and 11, wherein the aberration corrector is composed of four stages of electrostatic multipole elements and two stages of magnetic quadrupole elements for superimposing a magnetic potential distribution on an electric potential distribution created by two central stages of electrostatic quadrupole elements of the four stages, the magnetic potential distribution being analogous to the electric potential distribution, and wherein said charged-particle beam system further includes an objective lens for focusing the beam of charged particles onto a specimen, means for applying a decelerating voltage to the specimen, a manipulation portion permitting a human operator to modify the accelerating voltage of the beam or the working distance between the objective lens and the specimen, and a control portion for controlling the multipole elements based on manipulation of the manipulation portion or on settings.

\* \* \* \* \*